United States Patent
Chen et al.

(10) Patent No.: US 9,269,687 B2
(45) Date of Patent: Feb. 23, 2016

(54) PACKAGING METHODS AND PACKAGED SEMICONDUCTOR DEVICES

(71) Applicant: Taiwan Semiconductor Manufacturing Company, Ltd., Hsin-Chu (TW)

(72) Inventors: Meng-Tse Chen, Changzhi Township (TW); Wei-Hung Lin, Xinfeng Township (TW); Yu-Peng Tsai, Taipei (TW); Chun-Cheng Lin, New Taipei (TW); Chih-Wei Lin, Xinfeng Township (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/265,164

(22) Filed: Apr. 29, 2014

(65) Prior Publication Data
US 2014/0231988 A1    Aug. 21, 2014

Related U.S. Application Data

(62) Division of application No. 13/416,805, filed on Mar. 9, 2012.

(51) Int. Cl.
*H01L 23/00* (2006.01)
*H01L 25/10* (2006.01)
(Continued)

(52) U.S. Cl.
CPC ............... *H01L 24/32* (2013.01); *B23K 35/24* (2013.01); *B23K 35/3612* (2013.01); *H01L 23/49816* (2013.01); *H01L 24/17* (2013.01); *H01L 25/105* (2013.01); *H01L 25/50* (2013.01); *H01L 2224/16237* (2013.01); *H01L 2224/32145* (2013.01); *H01L 2224/32225* (2013.01); *H01L 2224/48091* (2013.01); *H01L 2224/48228* (2013.01); *H01L 2224/73204* (2013.01); *H01L 2224/73265* (2013.01);
(Continued)

(58) Field of Classification Search
None
See application file for complete search history.

(56) References Cited

U.S. PATENT DOCUMENTS 5,424,251 A     6/1995   Sono
5,914,536 A  *  6/1999   Shizuki et al. ................ 257/778
(Continued)

FOREIGN PATENT DOCUMENTS

| CN | 101894772 A | 11/2010 |
|---|---|---|
| CN | 101958261 A | 1/2011 |
| CN | 102097397 A | 6/2011 |

OTHER PUBLICATIONS

Chapter 19: Flip Chip Assembly and Underfilling by R. Wayne Johnson, Taken from Handbook of Area Array Packaging published to McGraw Hill, 2001.*

(Continued)

*Primary Examiner* — Evren Seven
(74) *Attorney, Agent, or Firm* — Slater & Matsil, L.L.P.

(57) ABSTRACT

Packaging methods and packaged semiconductor devices are disclosed. In one embodiment, a packaging method includes providing a first die, partially packaging the first die, and forming a plurality of solder balls on a surface of the partially packaged first die. An epoxy flux is disposed over the plurality of solder balls. A second die is provided, and the second die is partially packaged. The plurality of solder balls is coupled to the partially packaged second die.

18 Claims, 8 Drawing Sheets

(51) Int. Cl.
*H01L 23/498* (2006.01)
*B23K 35/36* (2006.01)
*B23K 35/24* (2006.01)
*H01L 25/00* (2006.01)
*H01L 21/00* (2006.01)

(52) U.S. Cl.
CPC ............... *H01L 2224/81815* (2013.01); *H01L 2225/1023* (2013.01); *H01L 2225/1058* (2013.01); *H01L 2924/0665* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 6,028,357 A * | 2/2000 | Moriyama | 257/737 |
| 6,235,554 B1 | 5/2001 | Akram et al. | |
| 6,303,997 B1 | 10/2001 | Lee | |
| 6,642,136 B1 * | 11/2003 | Lee et al. | 438/613 |
| 6,646,353 B1 | 11/2003 | Lopatin | |
| 6,646,356 B1 | 11/2003 | Whalen et al. | |
| 6,680,217 B2 | 1/2004 | Whalen et al. | |
| 6,791,195 B2 | 9/2004 | Urushima | |
| 7,145,225 B2 | 12/2006 | Lee | |
| 7,189,593 B2 | 3/2007 | Lee | |
| 7,198,980 B2 | 4/2007 | Jiang et al. | |
| 7,345,361 B2 | 3/2008 | Malik et al. | |
| 7,446,420 B1 | 11/2008 | Kim | |
| 7,528,007 B2 | 5/2009 | Fee et al. | |
| 7,528,474 B2 | 5/2009 | Lee | |
| 7,550,832 B2 | 6/2009 | Weng et al. | |
| 7,573,136 B2 | 8/2009 | Jiang | |
| 7,576,413 B2 | 8/2009 | Ishihara et al. | |
| 7,674,651 B2 * | 3/2010 | Oyama et al. | 438/106 |
| 7,749,888 B2 | 7/2010 | Nishiyama | |
| 7,820,543 B2 * | 10/2010 | Chang et al. | 438/613 |
| 7,863,727 B2 * | 1/2011 | Lake | 257/698 |
| 7,964,952 B2 | 6/2011 | Lee | |
| 7,969,004 B2 * | 6/2011 | Ohnishi | 257/737 |
| 8,004,074 B2 | 8/2011 | Mori et al. | |
| 8,018,043 B2 | 9/2011 | Suh et al. | |
| 8,076,787 B2 | 12/2011 | Hayashi | |
| 8,125,065 B2 | 2/2012 | Lee | |
| 8,143,710 B2 | 3/2012 | Cho | |
| 8,169,064 B2 | 5/2012 | Kim | |
| 8,178,984 B2 | 5/2012 | Corisis et al. | |
| 8,269,326 B2 | 9/2012 | Lee | |
| 8,299,595 B2 | 10/2012 | Yoon et al. | |
| 8,300,423 B1 | 10/2012 | Darveaux et al. | |
| 8,304,900 B2 | 11/2012 | Jang et al. | |
| 8,334,171 B2 | 12/2012 | Pagaila et al. | |
| 8,390,108 B2 | 3/2013 | Cho et al. | |
| 8,405,197 B2 * | 3/2013 | Ha et al. | 257/686 |
| 8,409,920 B2 * | 4/2013 | Pendse et al. | 438/109 |
| 8,421,245 B2 * | 4/2013 | Gonzalez et al. | 257/777 |
| 8,431,478 B2 * | 4/2013 | Shen | 438/614 |
| 8,456,856 B2 | 6/2013 | Lin et al. | |
| 8,546,945 B2 * | 10/2013 | Kuo et al. | 257/757 |
| 8,633,100 B2 * | 1/2014 | Yang et al. | 438/612 |
| 8,669,173 B2 * | 3/2014 | Lee | 438/612 |
| 8,723,302 B2 * | 5/2014 | Chandra et al. | 257/686 |
| 8,895,440 B2 | 11/2014 | Choi et al. | |
| 2001/0054771 A1 * | 12/2001 | Wark et al. | 257/786 |
| 2004/0262774 A1 * | 12/2004 | Kang et al. | 257/777 |
| 2006/0113681 A1 * | 6/2006 | Jeong et al. | 257/780 |
| 2006/0220259 A1 * | 10/2006 | Chen et al. | 257/778 |
| 2007/0200234 A1 * | 8/2007 | Gerber et al. | 257/734 |
| 2009/0085185 A1 * | 4/2009 | Byun et al. | 257/686 |
| 2009/0091015 A1 | 4/2009 | Shen et al. | |
| 2009/0098731 A1 | 4/2009 | Gan et al. | |
| 2009/0115044 A1 | 5/2009 | Hoshino et al. | |
| 2009/0206461 A1 * | 8/2009 | Yoon | 257/686 |
| 2009/0243072 A1 * | 10/2009 | Ha et al. | 257/686 |
| 2010/0102444 A1 * | 4/2010 | Khor et al. | 257/737 |
| 2010/0140779 A1 | 6/2010 | Lin et al. | |
| 2010/0171207 A1 | 7/2010 | Shen et al. | |
| 2010/0244223 A1 | 9/2010 | Cho et al. | |
| 2011/0068453 A1 | 3/2011 | Cho et al. | |
| 2011/0068478 A1 | 3/2011 | Pagaila et al. | |
| 2011/0128711 A1 | 6/2011 | Yim et al. | |
| 2011/0241218 A1 | 10/2011 | Meyer et al. | |
| 2011/0256662 A1 | 10/2011 | Yamano et al. | |
| 2012/0032341 A1 * | 2/2012 | Chao et al. | 257/774 |
| 2012/0043655 A1 * | 2/2012 | Khor et al. | 257/738 |
| 2012/0104624 A1 | 5/2012 | Choi et al. | |
| 2012/0217629 A1 | 8/2012 | Cho et al. | |
| 2012/0217642 A1 | 8/2012 | Sun | |
| 2012/0252163 A1 | 10/2012 | Yoo et al. | |
| 2012/0326324 A1 | 12/2012 | Lee et al. | |
| 2013/0128485 A1 | 5/2013 | Lu | |
| 2013/0147043 A1 * | 6/2013 | Gonzalez et al. | 257/738 |
| 2013/0285237 A1 * | 10/2013 | Yu et al. | 257/738 |
| 2013/0285238 A1 * | 10/2013 | Chen et al. | 257/738 |
| 2013/0292846 A1 | 11/2013 | Lee et al. | |
| 2014/0124928 A1 * | 5/2014 | Lin et al. | 257/738 |
| 2014/0124937 A1 * | 5/2014 | Wu | 257/772 |
| 2014/0367848 A1 | 12/2014 | Chi et al. | |
| 2014/0374902 A1 | 12/2014 | Lee et al. | |

OTHER PUBLICATIONS

"Epoxy Flux Stealing Tacky Flux's Limelight?," by the Henkel Corporation, Jul. 2, 2009, 1 page.

Lee, "Epoxy Flux-A Low Cost High Reliability Approach for PoP Assembly," http://www.slideshare.net/nclee715epoxy-flux-a-low-cost-high-reliability-approach-for-pop-assemblyimaps-2011 # on Oct. 28, 2011, 8 pages.

Johnson, R.W., "Flip Chip Assembly and Underfilling," Taken from Chapter 19 of Handbook of Area Array Packaging, published by McGraw Hill Professional, 2001, 58 pages.

* cited by examiner

PACKAGING METHODS AND PACKAGED SEMICONDUCTOR DEVICES

CROSS-REFERENCE TO RELATED CASES

This application is a divisional of, and claims priority to, U.S. patent application Ser. No. 13/416,805, filed on Mar. 9, 2012 and titled "Packaging Methods and Packaged Semiconductor Devices," which application is incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer and then singulated by sawing the integrated circuits along a scribe line. The individual dies may then be packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packaging for semiconductor devices that has been developed is wafer level packaging (WLP), in which dies are packaged in packages that may include a redistribution layer (RDL) that is used to fan out wiring for contact pads of the integrated circuit die so that electrical contact can be made on a larger pitch than contact pads of the die. Another type of packaging for semiconductor devices is referred to as a bump on trace (BOT) package, in which dies or "flip-chips" are attached or soldered to traces on the BOT packages.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to packaging methods and structures for semiconductor devices. Novel methods of packaging semiconductor devices and structures thereof will be described herein.

Figure 1:
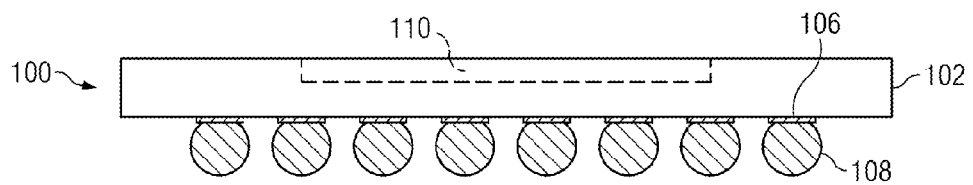
FIGS. 1 through 3 show cross-sectional views of a method of packaging semiconductor devices at various stages in accordance with an embodiment of the present disclosure.
Figure 2:
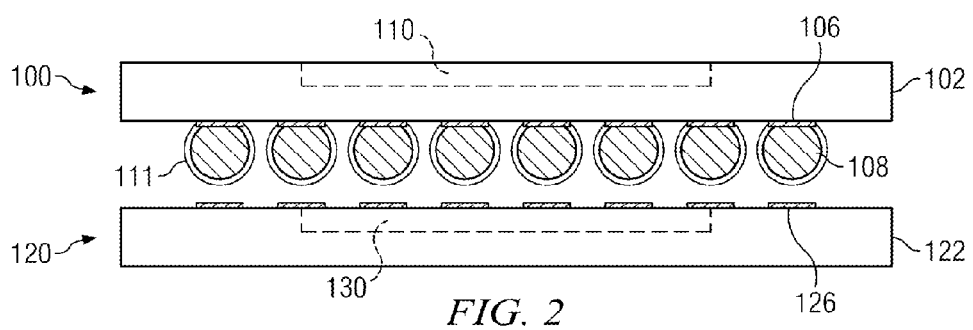
Figure 3:
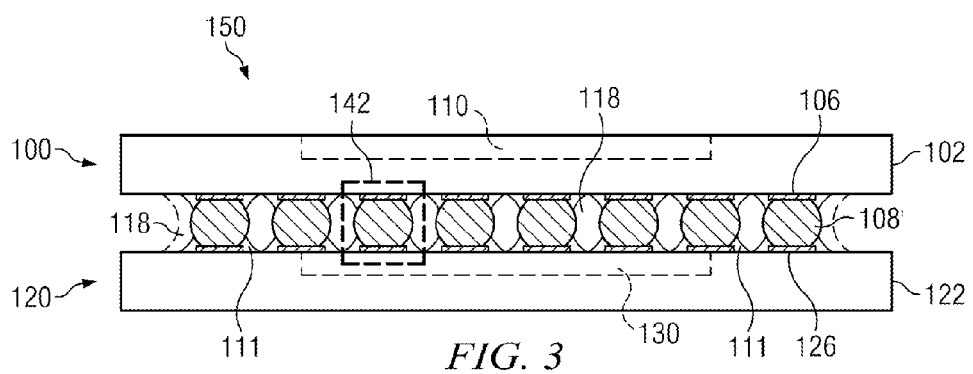

FIGS. 1 through 3 show cross-sectional views of a method of packaging semiconductor devices at various stages in accordance with an embodiment of the present disclosure. A first partially packaged die 100 is packaged with a second partially packaged die 120 in accordance with embodiments. Referring first to FIG. 1, a first die 110 (shown in phantom in FIG. 1) is provided. The first die 110 comprises an integrated circuit or chip that will be packaged with a second die (see second die 130 shown in phantom in FIG. 2) in a single package. The first die 110 and the second die 130 may each include a workpiece that may include a semiconductor substrate comprising silicon or other semiconductor materials and may be covered by an insulating layer, for example. The first die 110 and second die 130 may include one or more components and/or circuits formed in and/or over the workpiece, not shown. The first die 110 and second die 130 may include conductive layers and/or semiconductor elements, e.g., transistors, diodes, capacitors, etc., also not shown. The dies 110 and 130 may comprise logic circuitry, memory devices, or other types of circuits, as examples. The dies 110 and 130 may include a plurality of contacts formed on a surface thereof.

In some embodiments, the first die 110 comprises a memory device such as a random access memory (RAM) or other types of memory devices, and the second die 130 comprises a logic device. Alternatively, the first die 110 and the second die 130 may comprise other functional circuitry.

The first die 110 is partially packaged to form a first partially packaged die 100, as shown in FIG. 1. The first partially packaged die 100 is also referred to herein as a partially packaged first die. The first die 110 may be partially packaged by attaching the first die 110 to a first substrate 102. The first substrate 102 may comprise an interposer, to be described further herein. The first substrate 102 includes a plurality of contacts 106 formed on a bottom surface thereof. The contacts 106 may comprise Cu, Al, Au, alloys thereof, other materials, or combinations and/or multiple layers thereof, as examples. The contacts 106 may alternatively comprise other materials.

In accordance with embodiments, a plurality of solder balls 108 are coupled to the contacts 106 on the bottom surface of the first substrate 102, as shown in FIG. 1. An epoxy flux 111 is disposed over the plurality of solder balls 108, as shown in FIG. 2. The epoxy flux 111 is formed on each of the plurality of solder balls 108, for example. The epoxy flux 111 includes a flux component and an epoxy component. The flux component may comprise activators, solvents, and/or additives. In some embodiments, the flux component may comprise zinc chloride, ammonium chloride, hydrochloric acid, phosphoric acid, or hydrobromic acid, as examples. The epoxy component may comprise polyepoxide, as an example. The epoxy component may comprise a similar material or the same material used for the molding compound 116 and/or 136 (see FIGS. 7 and 8, respectively) which will be described further herein, for example. The flux component may comprise a material adapted to reduce or remove oxides on the solder balls 108, to improve the solder joint 108' (see FIG. 3) formed by the solder balls 108, as an example. Alternatively, the epoxy flux 111 may comprise other materials and may include other components.

The epoxy flux 111 may be formed on the plurality of solder balls 108 by dipping the plurality of solder balls 108 in the epoxy flux 111 in some embodiments. The epoxy flux 111 may comprise a liquid that is poured into a tray, and the partially packaged first die 100 may be placed proximate the tray and lowered towards the epoxy flux 111 until the plurality of solder balls 108 are at least partially submerged in the epoxy flux 111, for example. A portion of the epoxy flux 111 adheres to the solder balls 108, e.g., due to a meniscus effect. Alternatively, the epoxy flux 111 may be sprayed onto the solder balls 108, i.e., using a jet-spray process. The epoxy flux 111 may also be formed on the plurality of solder balls 108 using other methods.

An amount of epoxy flux 111 that is formed on the solder balls 108 may be adjusted and/or controlled by altering an amount of the flux component of the epoxy flux 111 relative to the epoxy component in some embodiments. The flux component may be less viscous than the epoxy component in some embodiments, and increasing the amount of flux component may cause the epoxy flux 111 to flow faster and easier, thus forming less epoxy flux 111 on the solder balls 108, in some embodiments. Alternatively, a thickness of the epoxy flux 111 may be controlled by the jetting or the dipping amount. The thickness of the epoxy flux 111 may also be controlled using other methods. In some embodiments, the epoxy flux 111 comprises a storage modulus of about 0.1 to 10 GPa, for example.

The second die 130 is provided, and the second die 130 is also partially packaged on a second substrate 122, as described for the first die 110, forming a second partially packaged die 120, also shown in FIG. 2. The second partially packaged die 120 is also referred to herein as a partially packaged second die. The second die 130 may be partially packaged using a similar method as the first die 110 is partially packaged in some embodiments. In other embodiments, the second die 130 may be partially packaged using a different method than a method used to partially package the first die 110. In some embodiments, the first die 110 is partially packaged using a flip-chip wafer level packaging (WLP) technique and wire bonding, and the second die 130 is partially packaged using a flip-chip and bump-on-trace (BOT) technique, as an example. Alternatively, the first die 110 and the second die 130 may be partially packaged using other methods or techniques. The second partially packaged die 120 includes a plurality of contacts 126 formed on a top surface thereof.

The plurality of solder balls 108 having the epoxy flux 111 formed thereon on the first partially packaged die 100 are then coupled to the second partially packaged die 120, as shown in FIG. 3. A solder reflow process may be used to couple the plurality of solder balls 108 to the contacts 126 of the partially packaged second die 120. The solder reflow process reflows a solder material of the solder balls 108, electrically and mechanically attaching the solder balls 108 to the contacts 126 of the partially packaged second die 120.

The solder balls 108 become solder joints 108' after being attached to the contacts 126 of the partially packaged second die 120, as shown in FIG. 3. The solder joints 108' comprise the material of the solder balls 108 after the reflow process to attach the solder balls 108 to the partially packaged second die 120.

Advantageously, the flux component of the epoxy flux 111 facilitates the soldering of the solder balls 108 to the contacts 126 of the partially packaged second die 120. The flux component may be adapted to at least partially evaporate during the solder process to attach the solder balls 108 to the partially packaged second die 130. In some embodiments, the flux component of the epoxy flux 111 substantially entirely evaporates during the soldering process, so that a cleaning process to remove any flux residue is not required, for example. In other embodiments, the flux component of the epoxy flux 111 is not entirely evaporated. In these embodiments, the flux component may comprise a material that is not detrimental to subsequent packaging steps and may thus be left remaining in the packaged semiconductor device 150. In other embodiments, a cleaning process may be used to remove the flux component left remaining from the epoxy flux 111 after the solder reflow process, as another example.

In some embodiments, an optional underfill material 118, shown in phantom in FIG. 3, may be applied after the first partially packaged die 100 is coupled to the second partially packaged die 120 using the solder balls 108 with epoxy flux 111 formed thereon. The underfill material 118 may be applied using a dispensing needle along one or more edges of the packaged semiconductor device 150, for example, although other methods may also be used to form the underfill material 118. The underfill material 118 may comprise an epoxy or a polymer, although other materials may alternatively be used. However, in accordance with some embodiments, an underfill material 118 is not required, due to the use of the epoxy flux 111 having the epoxy component. Thus, the use of the epoxy flux 111 in the packaging method advantageously avoids a processing step and a material in the packaging process in some embodiments, lowering packaging costs and time.

Figure 4A:
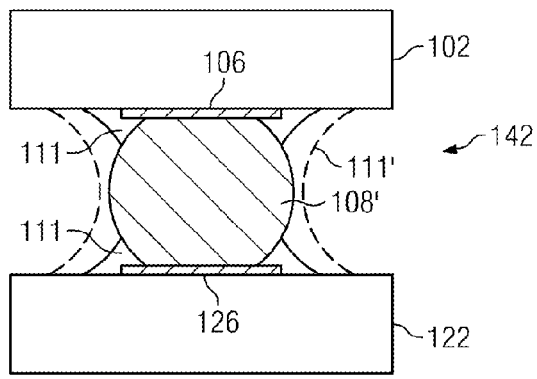
FIGS. 4A through 4C illustrate more detailed cross-sectional views of a solder joint region of FIG. 3, showing an epoxy flux disposed on the solder joints and different shapes of the solder joints in accordance with embodiments.
Figure 4B:
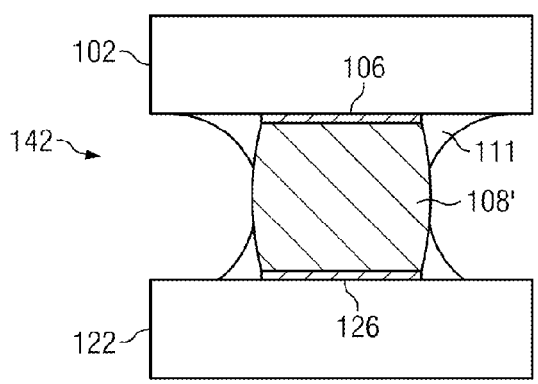
Figure 4C:
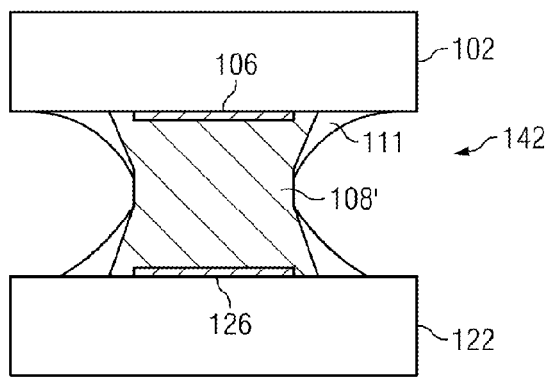

Advantageously, the use of the novel epoxy flux 111 in the packaged semiconductor device 150 results in at least a portion of the epoxy component of the epoxy flux 111 being left remaining on the solder joints 108' after the soldering process, as shown in FIGS. 4A through 4C, which illustrate more detailed cross-sectional views of a solder joint region 142 of FIG. 3. The epoxy flux 111 left remaining surrounds the solder joints 108', protecting and strengthening the solder joints 108'.

Figure 4D:
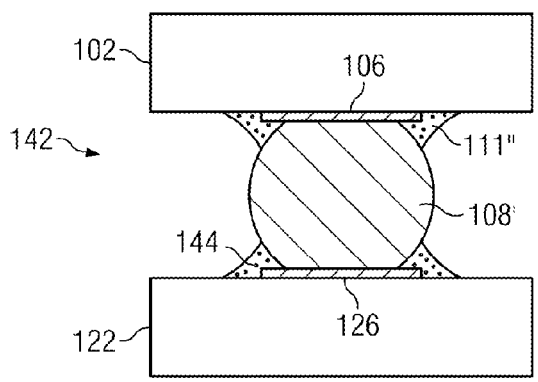
FIG. 4D is a cross-sectional view of an embodiment wherein the epoxy flux includes a filler material.
Figure 9:
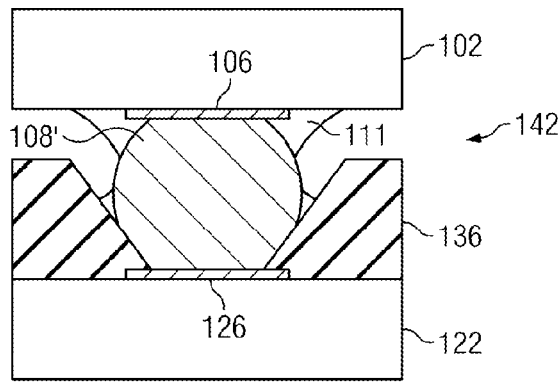
FIG. 9 illustrates a more detailed cross-sectional view of a solder joint region of FIG. 8.
Figure 11:
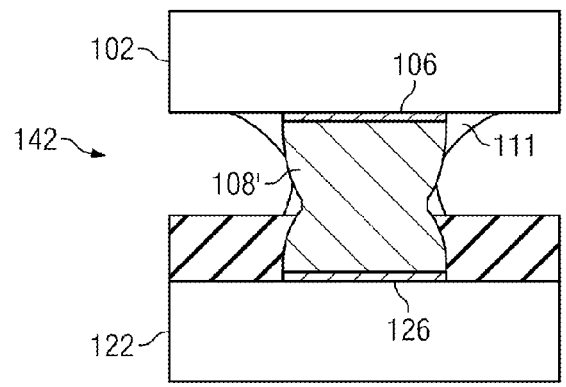
FIG. 11 illustrates a more detailed cross-sectional view of a solder joint region of FIG. 10.

Also illustrated in FIGS. 4A through 4C (and also FIGS. 4D, 6, 9, and 11) are different shapes of the solder joints 108' in accordance with embodiments after the solder reflow process. The plurality of solder joints 108' may substantially comprise a shape of a circle or oval in a cross-sectional view, as shown in FIGS. 4A, 4D, and 9. Alternatively, the plurality of solder joints 108' may substantially comprise a shape of a barrel in a cross-sectional view, as shown in FIG. 4B. In other embodiments, the plurality of solder joints 108' may substantially comprise a shape of an hour glass in a cross-sectional view, as shown in FIG. 4C, or a shape of a portion of a figure eight, as shown in FIG. 11.

In FIG. 4A, a portion of the epoxy flux 111 is left remaining after the soldering process proximate the solder joints 108', in accordance with embodiments. The epoxy flux 111 may comprise a greater thickness adjacent the plurality of solder joints 108' proximate the first substrate 102 and the second substrate 122 than proximate a wider central region of the plurality of solder joints 108', in some embodiments. The epoxy flux 111 may not reside at all on the central region of the plurality of solder joints 108' in some embodiments, as shown in FIG. 4A. Alternatively, a small amount of epoxy flux 111 may reside on the central region of the plurality of solder joints 108' in some embodiments, as shown in phantom at 111' in FIG. 4A. The small amount of epoxy flux 111' may also reside on the central region of the plurality of solder joints 108' in the other embodiments described herein, not shown in the drawings. The epoxy flux 111 or 111' left remaining on the solder joints 108' may comprise only the epoxy component in some embodiments, or both the epoxy component and a portion of the flux component, in other embodiments.

The solder joints 108' join together the contacts 106 on the first substrate 102 and the contacts 126 on the second substrate 122. The epoxy flux 111 or 111' left remaining on the solder joints 108' advantageously strengthens the solder joints 108' and reduces or prevents cracking due to thermal and/or mechanical stress, e.g., during the packaging process, during thermal cycling tests or other tests of the packaged semiconductor device 150 (see FIG. 3), during shipping of the packaged semiconductor device 150, and/or when the packaged semiconductor device 150 is used in an end application. Thus, the epoxy flux 111 or 111' improves the electrical and mechanical connection provided by the solder joints 108' that join the first substrate 102 to the second substrate 122.

FIG. 4D is a cross-sectional view of an embodiment wherein the epoxy flux 111" includes a filler material 144. The filler material 144 may comprise an insulating material or conductive material, for example. In some embodiments the filler material 144 may comprise $SiO_2$ or aluminum nitride, as examples, although alternatively, the filler material 144 may comprise other types of materials. The filler material 144 may comprise about 20 to 90% by volume or weight of the epoxy flux 111, as an example. Alternatively, other amounts of the filler material 144 may be used. The filler material 144 is adapted to increase a thermal conductivity of the epoxy flux 111" in some embodiments, for example. The filler material 144 may alternatively have other functions.

Figure 5:
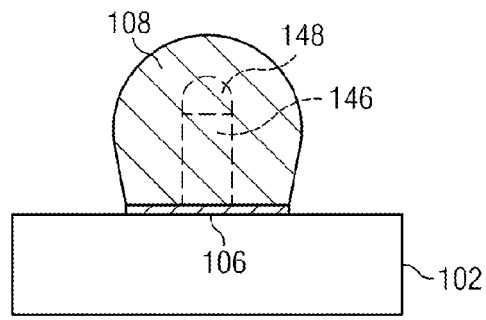
FIGS. 5 and 6 show cross-sectional views of embodiments wherein solder balls that form the solder joints include a metal stud.
Figure 6:
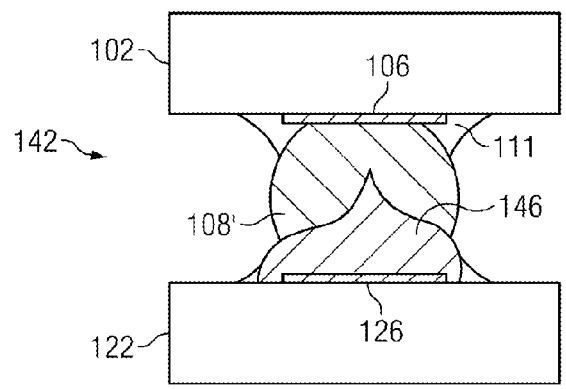

FIGS. 5 and 6 show cross-sectional views of embodiments wherein the solder balls 108 include a metal stud 146. The contacts 106 on the first substrate 102 may include a metal stud 146 formed thereon, as shown in phantom in FIG. 5. The metal stud 146 may also comprise a metal pillar, for example. The metal stud 146 may comprise Au, Cu, or other metals, for example. The solder balls 108 are formed on the metal studs 146 in this embodiment, as shown. An optional silicide 148 comprising $NiSi_x$ or other materials may be formed over the metal studs 146 in some embodiments, for example. FIG. 6 shows a cross-sectional view of a solder joint region 142 formed by the solder ball 108 in FIG. 5 after a solder reflow process in accordance with an embodiment. A portion of the metal stud 146 may be viewable in a cross-sectional view of the solder joint 108' after the solder reflow process, in some embodiments, as shown.

Figure 7:
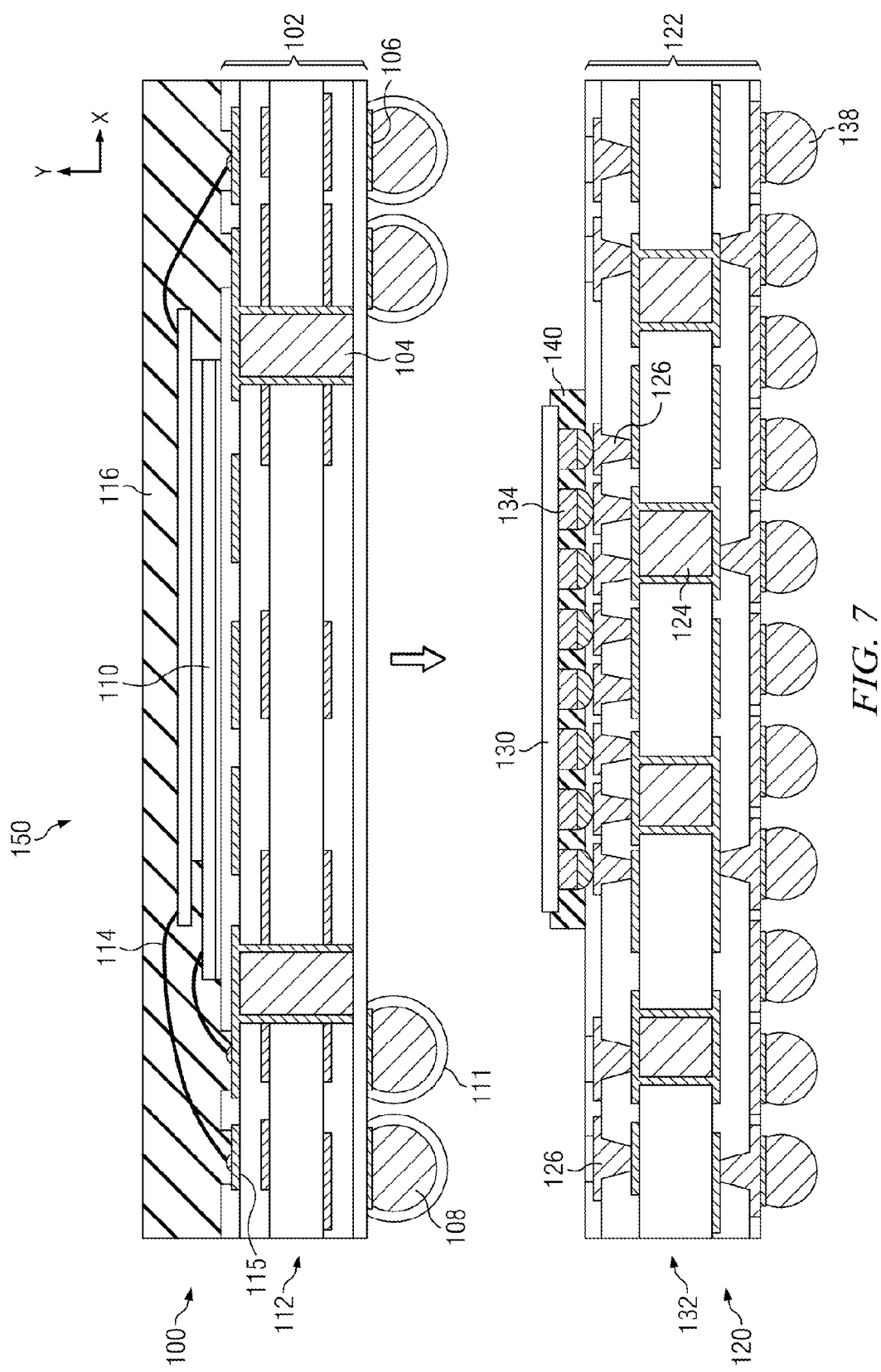
FIGS. 7 and 8 show cross-sectional views of methods of packaging semiconductor devices in accordance with embodiments.

FIG. 7 shows a cross-sectional view of a method of packaging semiconductor devices in accordance with an embodiment. More detailed views of the substrates 102 and 122 are shown. Note that in the embodiments shown in FIGS. 7, 8, 10, and 12, the packaged semiconductor devices 150 are shown before the first partially packaged die 100 is coupled to the second partially packaged die 120 using the solder balls 108 having the epoxy flux 111 disposed thereon. The final packaged semiconductor devices 150 actually comprise the first partially packaged die 100 coupled to the second partially packaged die 120 using the solder joints 108' having the epoxy flux 111 disposed thereon, as shown in FIG. 3.

Referring again to FIG. 7, the first substrate 102 and/or the second substrate 122 may comprise interposers in some embodiments. The first substrate 102 and/or the second substrate 122 may include a plurality of through-substrate vias (TSVs) 104 and 124, respectively, and may comprise TSV interposers in some embodiments. The TSVs 104 and 124 comprise conductive or semiconductive material that extends completely through the substrates 102 and/or 122. The TSVs 104 and 124 may optionally be lined with an insulating material. The TSVs 104 and 124 provide vertical electrical connections (e.g., y-axis connections) from a bottom surface to a top surface of the substrates 102 and 122, respectively. The first substrate 102 and/or the second substrate 122 may include electronic components and elements formed thereon in some embodiments, or alternatively, the first substrate 102 and/or the second substrate 122 may be free of electronic components and elements.

The substrates 102 and/or 122 may each include wiring 112 and 132, respectively. The wiring 112 and/or 132 provides horizontal electrical connections (e.g., x-axis connections) in some embodiments, for example. The wiring 112 and 132 may include fan-out regions that include traces of conductive material for expanding the footprint of the first die 110 and second die 130 to a footprint of a bottom side of the substrates 102 and/or 122, respectively, e.g., of contacts 106 of the first substrate 102 (and contacts within wiring 132 of the second substrate 122, not labeled) that are coupled to the solder balls 108 and solder balls 138, respectively.

The wiring 112 and/or 132 of the substrates 102 and 122 may include one or more redistribution layers (RDLs). The RDLs may comprise one or more insulating layers and wiring layers. The RDLs may include inter-level dielectrics (ILDs) with wiring in metallization layers disposed or formed therein. The wiring 112 and 132 may comprise one or more vias and/or conductive lines, for example. The wiring 112 and 132, and also the TSVs 104 and 124, may be formed using one or more subtractive etch processes, single damascene techniques, and/or dual damascene techniques, as examples. One or more carrier wafers, not shown, may be used to form the wiring 112 and 132 and/or the TSVs 104 and 124. A portion of the wiring 112 and 132 resides on the top and bottom surfaces of the substrates 102 and 122, respectively; e.g., portions of the wiring 112 of the first substrate 102 may comprise contacts 106, wire bond pads 115 and/or other traces, and portions of the wiring 132 of the second substrate 122 may comprise contacts 126 and other contacts (not labeled) or traces that are coupleable to other elements, such as the solder balls 138 formed on the bottom surface of the second substrate 122.

In some embodiments, the first substrate 102 may not include an RDL in the wiring 112, as shown in FIG. 7. All or some of the x-axis or horizontal electrical connections may be made using the wire bonds 114 that couple contacts on the first die 110 to wire bond pads 115 on the first substrate 102, in this embodiment. In some embodiments, the second substrate 122 may include two RDLs in the wiring 132, also shown in FIG. 7. One RDL may be disposed proximate the top surface of the second substrate 122 and may be adapted to make x-axis electrical connections between contacts 126 coupled to microbumps 134 and contacts 126 that will be coupled to the solder balls 108. The other RDL may be disposed proximate the bottom surface of the second substrate 122 and may be adapted to make x-axis electrical connections between the TSVs 124 and the contacts coupled to the plurality of solder balls 138 disposed on the bottom surface of the second substrate 122, for example.

A method of attaching the dies 110 and 130 to the substrates 102 and 122, respectively, is also illustrated in FIG. 7. In the embodiment shown, the first die 110 is coupled to the first substrate 102 using a flip-chip technique, wherein wire bonds 114 are attached to contacts on the first die 110 at one end and wherein the wire bonds 114 are attached to contacts or wire bond pads 115 on the top surface of the first substrate 102 at the other end. The second die 130 is attached to the second substrate 122 using a flip-chip bond-on-trace (BOT) attachment technique, wherein microbumps 134 are coupled to the second die 130, and the microbumps 134 are then soldered to contacts 126 in a central region of the top surface of the second substrate 122, for example. An optional underfill material 140 may be formed under the second die 130, over the second substrate 122, as shown. The underfill material 140 may comprise similar materials and may be applied using similar methods as described for the optional underfill material 118 shown in FIG. 3, for example. Alternatively, other methods may be used to attach the first die 110 and/or the second die 130 to the first substrate 102 and/or the second substrate 122, respectively. The same method or a different method may be used to attach the first die 110 to the first substrate 102, than is used to attach the second die 130 to the second substrate 122.

Figure 8:
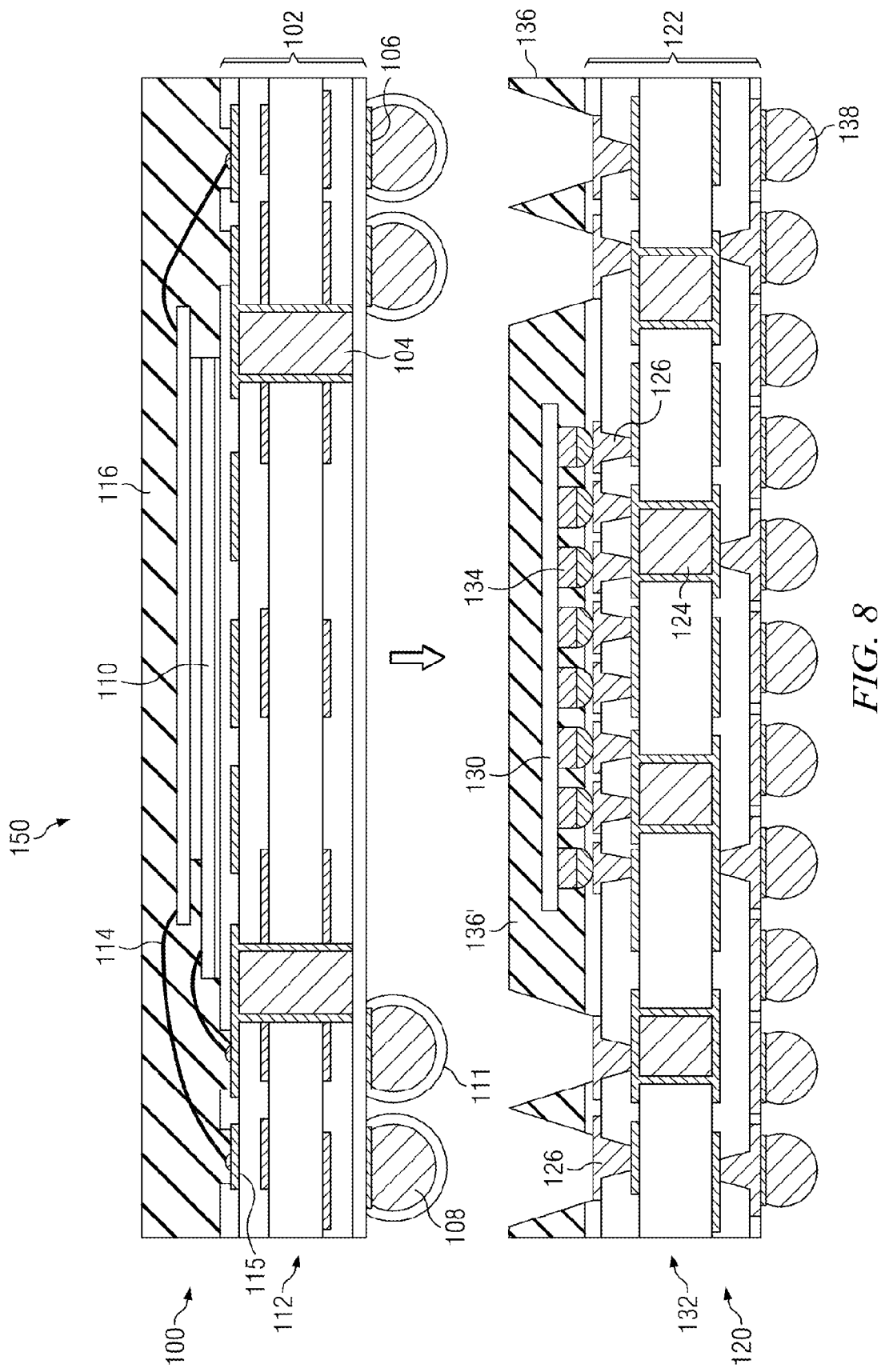

FIG. 8 illustrates a cross-sectional view of a method of packaging semiconductor devices in accordance with another embodiment. Like numerals are used to describe the various elements and components as were used in the previous figures. In this embodiment, a molding compound 136 is applied over the second partially packaged die 120 after the second die 130 is attached to the second substrate 122 and after the optional underfill material 140 is applied. The molding compound 136 may comprise similar materials as described for molding compound 116 of the first partially packaged die 100 shown in FIG. 7, for example.

A portion of the molding compound 136 is removed from over the top surface of the second substrate 122 over contacts 126, leaving the contacts 126 exposed. The top surface of the second substrate 122 may comprise a plurality of contacts 126 disposed thereon around a perimeter of the second substrate 122, as shown in FIG. 8. The second die 130 is attached to contacts 126 in a central region of the second substrate 122. Contacts 126 in a perimeter region of the second substrate 122 may be larger than contacts 126 in a central region of the second substrate 122, as shown. Portions of the molding compound 136 are removed from over the plurality of contacts 126 on the top surface of the second substrate 122 using lithography or a laser, as examples, or other methods may alternatively be used. The portions of the molding compound 136 removed may comprise through-molding vias (TMVs), for example. The plurality of solder balls 108 are attached to the top surface of the second substrate 122 through the TMVs formed in the molding compound 136. FIG. 9 illustrates a more detailed cross-sectional view of a solder joint region 142 of the embodiment shown in FIG. 8. The solder joints 108' may comprise a substantially circular shape in this embodiment.

Figure 10:
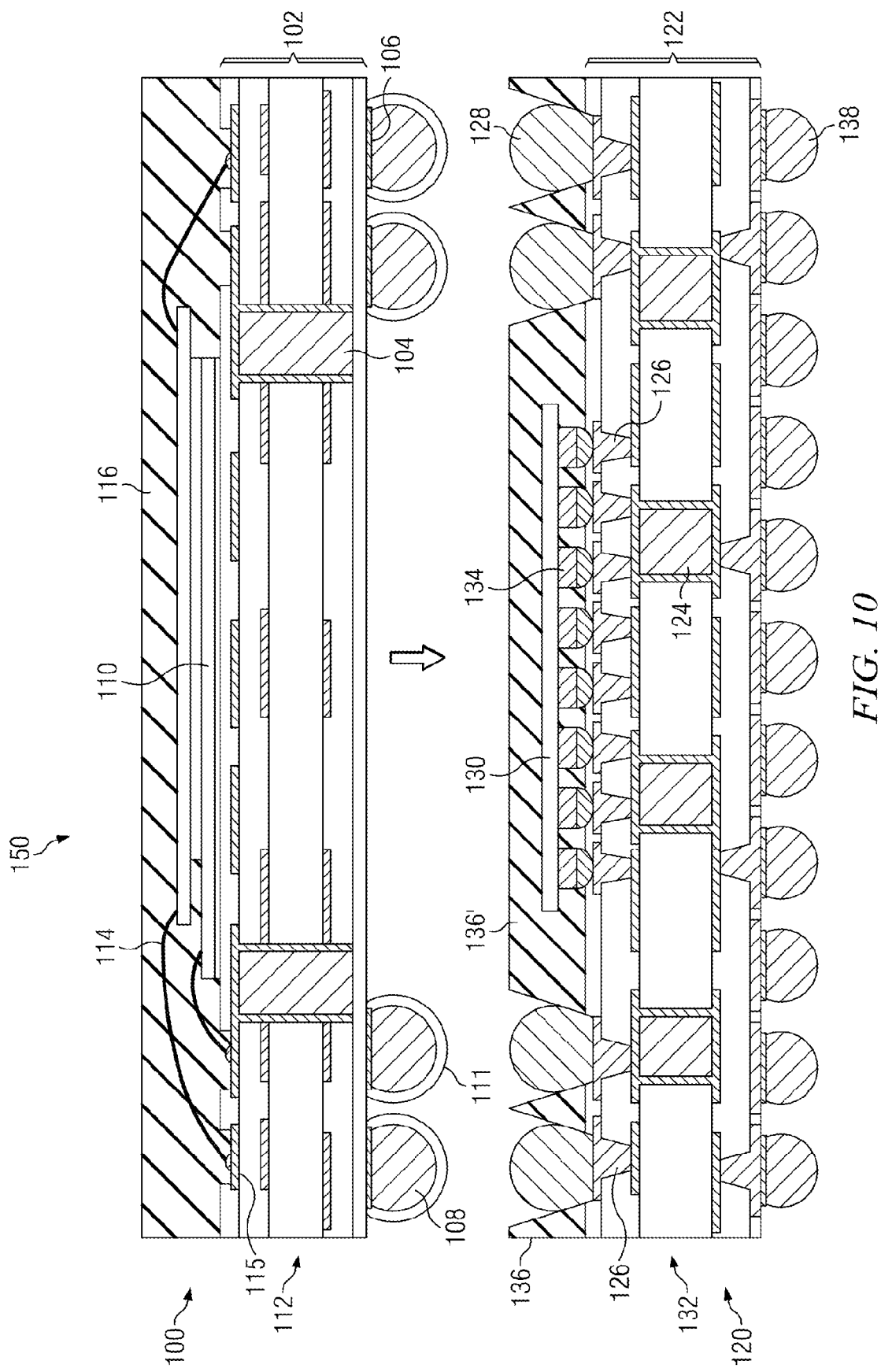
FIG. 10 shows a cross-sectional view of a method of packaging semiconductor devices in accordance with another embodiment.

FIG. 10 shows a cross-sectional view of a method of packaging semiconductor devices in accordance with another embodiment. After the molding compound 136 described in FIG. 8 is formed and patterned to expose the contacts 126 in the perimeter region of the second substrate 122, a plurality of solder balls 128 is formed on the plurality of contacts 126 exposed within the molding compound 136 on the second substrate 122, in this embodiment. The plurality of solder balls 128 on the second substrate 122 is then coupled to the plurality of solder balls 108 with epoxy flux 111 disposed thereon on the first substrate 102, and the solder of the solder balls 108 and 128 is reflowed. FIG. 11 illustrates a more detailed cross-sectional view of a solder joint region 142 of the embodiment shown in FIG. 10. The solder joints 108' after the reflow process comprise a portion of a figure eight shape in a cross-sectional view. The solder joints 108' comprise a bottom portion that includes the material of the solder balls 128 on the second substrate 122 and a top portion that includes the material of the solder balls 108 on the first substrate 102, after the solder reflow process.

Figure 12:
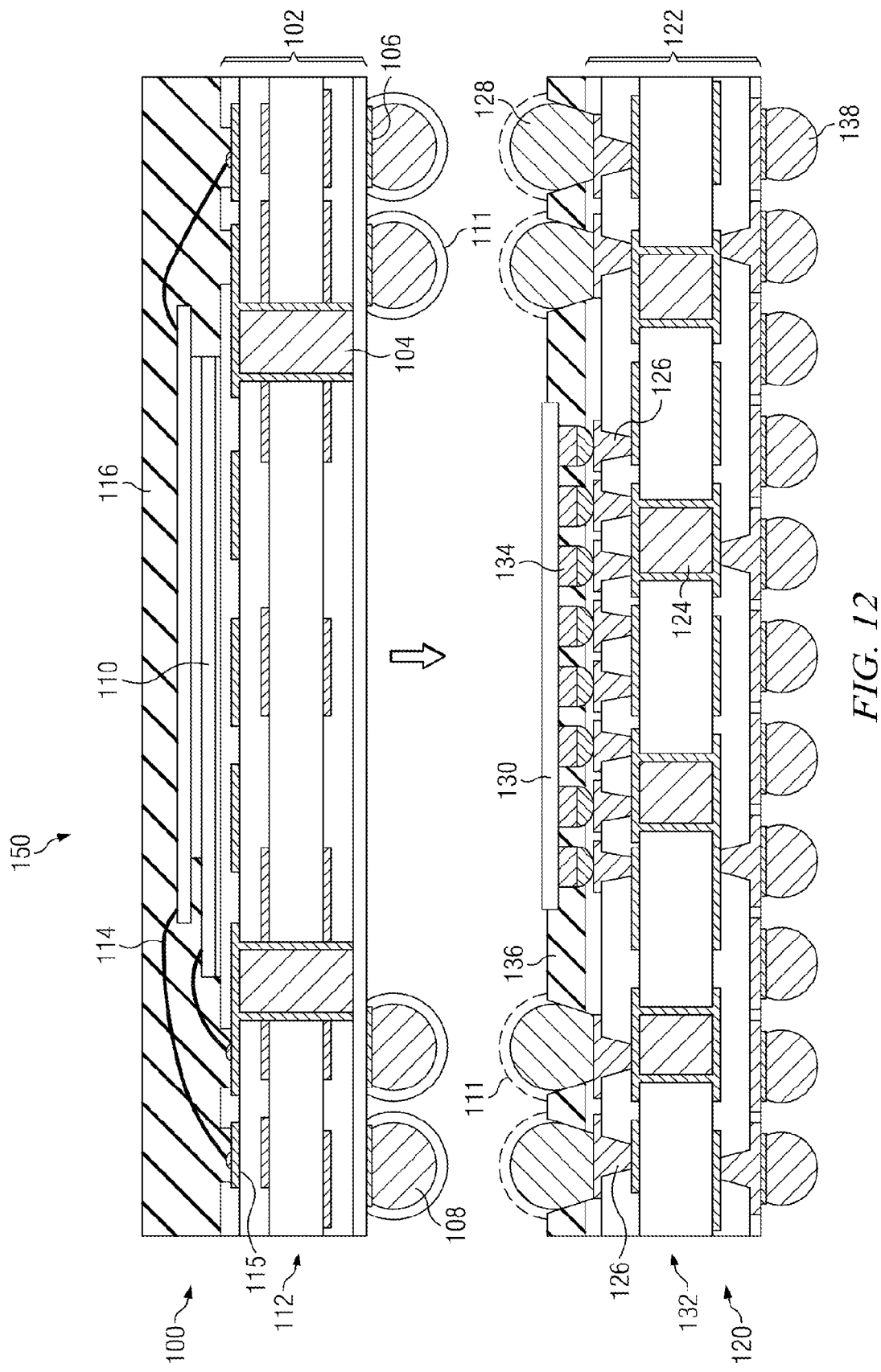
FIG. 12 shows a cross-sectional view of a method of packaging semiconductor devices in accordance with yet another embodiment.

In the embodiments shown in FIGS. 8 through 11, the molding compound 136 extends over a top surface of the second die 130, as shown at 136' in FIG. 8 and FIG. 10. In other embodiments, the molding compound 136 may be formed to a lower height over the second substrate 122 so that the second die 130 is not covered by the molding compound 136, as shown in FIG. 12. Alternatively, the molding compound 136 may be applied to cover the second die 130 initially, and the portion of the molding compound 136' (see FIG. 8 and FIG. 10) residing over the top surface of the second die 130 is then removed, e.g., using an etch-back process. In some embodiments such as the one shown in FIG. 12, solder balls 128 may be formed on the top surface of the second substrate 122 over the contacts 126, before the molding compound 136 is applied. The etch-back process used to remove the excess molding compound 136' may result in exposing a top portion of the solder balls 128 so that they may be attached to the solder balls 108 on the first substrate 102, for example.

In accordance with the embodiments shown in FIGS. 10 and 12 having solder balls 128 on the second partially packaged die 120, the epoxy flux 111 may be applied to solder balls 108 on the first partially packaged die 100. Alternatively, the epoxy flux 111 may not be applied to solder balls 108, but rather, the epoxy flux 111 may be applied to solder balls 128 disposed on the top surface of the second partially packaged die 120, as shown in phantom in FIG. 12. The epoxy flux 111 can be applied to either solder balls 108 or solder balls 128, for example. In other embodiments, the epoxy flux 111 may be applied to both the solder balls 108 on the first partially packaged die 100 and to the solder balls 128 on the second partially packaged die 120, for example.

Figure 13:
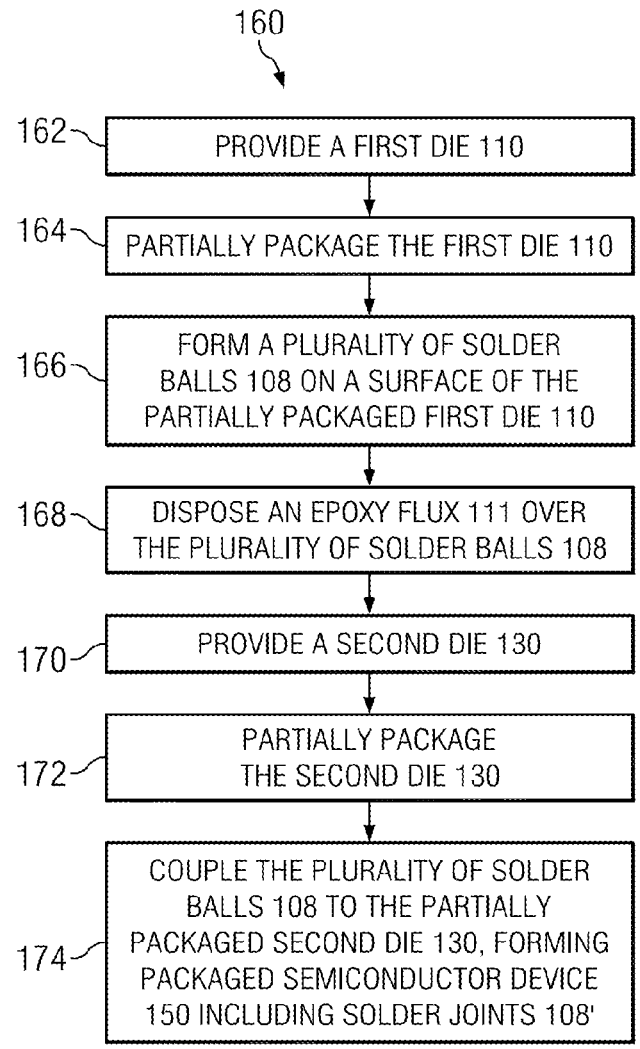
FIG. 13 is a flow chart of a packaging method in accordance with an embodiment of the present disclosure.

FIG. 13 is a flow chart 160 of a packaging method in accordance with an embodiment of the present disclosure. The method includes providing a first die 110 (step 162), partially packaging the first die 110 (step 164), and forming a plurality of solder balls 108 on a surface of the partially packaged first die 110 (step 166). An epoxy flux 111 is disposed over the plurality of solder balls 108 (step 168). The method includes providing a second die 130 (step 170), partially packaging the second die 130 (step 172), and coupling the plurality of solder balls 108 to the partially packaged second die 130 (step 174), forming the packaged semiconductor devices 150 shown in FIGS. 3, 7, 8, 10, and 12 that include solder joints 108'.

Embodiments of the present disclosure include methods of packaging semiconductor devices using the epoxy flux 111, 111', and 111" and also include packaged semiconductor devices 150 that include the epoxy flux 111, 111', and 111".

Advantages of embodiments of the present disclosure include providing novel packaging methods and structures 150 that utilize an epoxy flux 111, 111', or 111" on solder balls 108 and/or 128 used to connect partially packaged dies 100 and 120. Novel package-on-package (PoP) packaging techniques are disclosed that have improved solder joints 108' formed by the solder balls 108 and/or 128 that include the epoxy flux 111, 111', and 111" formed thereon. Joint cracks, which may occur at an interface between solder joints 108' (that comprise the solder ball 108 and/or 128 material) and solder pads (contacts 106 and/or 126), of PoP packages and packaging methods are reduced or prevented by surrounding the solder joints 108' with epoxy material from the epoxy flux 111, 111', and 111" which strengthens the solder connections. At least an epoxy component of the epoxy flux 111, 111', and 111" is left remaining surrounding the solder joints 108' after the solder reflow process, which protects and strengthens the solder joints 108' and also the metal studs 146, if included. The novel packaging methods and structures are easily implementable in packaging and manufacturing process flows.

In accordance with one embodiment of the present disclosure, a packaging method includes providing a first die, partially packaging the first die, and forming a plurality of solder balls on a surface of the partially packaged first die. An epoxy flux is disposed over the plurality of solder balls. A second die is provided, and the second die is partially packaged. The plurality of solder balls is coupled to the partially packaged second die.

In accordance with another embodiment, a packaging method includes providing a first die and providing a first interposer. The first interposer has a first surface and a second surface opposite the first surface and includes a first substrate having a plurality of first TSVs formed therein. The method includes attaching the first die to the second surface of the first interposer, and coupling a plurality of solder balls to the first surface of the first interposer. A second die is provided, and a second interposer is provided. The second interposer has a first surface and a second surface opposite the first surface and includes a second substrate including a plurality of second TSVs formed therein. The second die is attached to the second surface of the second interposer. The method includes forming an epoxy flux on the plurality of solder balls on the first interposer, and attaching the plurality of solder balls on the first interposer to the second surface of the second interposer.

In accordance with yet another embodiment, a packaged semiconductor device includes a first die coupled to a first substrate, and a second die coupled to a second substrate. A plurality of solder joints is coupled between the first substrate and the second substrate. An epoxy flux is coupled to each of the plurality of solder joints.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A packaged semiconductor device comprising:
a first die coupled to a first substrate;
a second die coupled to a second substrate;
a plurality of solder joints coupled between the first substrate and the second substrate;
an epoxy layer coupled to each of the plurality of solder joints; and
an underfill material disposed between the first substrate, the second substrate, and the epoxy layer coupled to the plurality of solder joints, the underfill material having a different material composition than the epoxy layer, the underfill material surrounding the epoxy layer coupled to the plurality of solder joints and being between adjacent solder joints of the plurality of solder joints;
wherein the plurality of solder joints includes a metal stud; and
wherein at least one of the plurality of solder joints contacts a first contact pad and a second contact pad on the first substrate and the second substrate, respectively, the metal stud of the at least one of the plurality of solder joints contacting the first contact pad but not contacting the second contact pad, at least a portion of the metal stud being exposed through a solder material of the at least one of the plurality of solder joints.

2. The packaged semiconductor device of claim 1, wherein the plurality of solder joints substantially comprise a shape of a barrel, a circle, or an oval in a cross-sectional view.

3. The packaged semiconductor device of claim 1, wherein the plurality of solder joints substantially comprise a shape of an hour glass or a portion of a figure eight in a cross-sectional view.

4. The packaged semiconductor device of claim 1, wherein the first die comprises a memory device and wherein the second die comprises a logic device.

5. The packaged semiconductor device of claim 1, wherein the epoxy layer comprises a filler material.

6. The packaged semiconductor device of claim 5, wherein the filler material comprises $SiO_2$ or aluminum nitride.

7. The packaged semiconductor device of claim 1, wherein the epoxy layer comprises a greater thickness adjacent the plurality of solder joints proximate the first substrate and the second substrate than proximate a central region of the plurality of solder joints.

8. The packaged semiconductor device of claim 1, wherein solder material of the plurality of solder joints is exposed through the epoxy layer in central regions of the plurality of solder joints.

9. The packaged semiconductor device of claim 1, wherein the epoxy layer covers solder material of the plurality of solder joints in central regions of the plurality of solder joints.

10. A semiconductor package comprising:
a first package comprising a first die coupled to a first substrate;
a second package comprising a second die coupled to a second substrate;

a plurality of solder joints coupled between the first package and the second package, at least one of the plurality of solder joints including a metal stud, the at least one of the plurality of solder joints contacting a first contact pad and a second contact pad on the first package and the second package, respectively, the metal stud of the at least one of the plurality of solder joints contacting the first contact pad but not contacting the second contact pad, at least a portion of the metal stud being exposed through a solder material of the at least one of the plurality of solder joints;

an epoxy layer on the plurality of solder joints; and an underfill surrounding the epoxy layer on the plurality of solder joints, the underfill having a different material composition than the epoxy layer, the underfill being between adjacent solder joints of the plurality of solder joints.

11. The semiconductor package of claim 10, wherein each of the plurality of solder joints comprises a metal stud.

12. The semiconductor package of claim 10, wherein a first portion of the metal stud directly adjoins the epoxy layer.

13. The semiconductor package of claim 12, wherein a second portion of the metal stud is exposed between the epoxy layer and a solder material of the at least one of the plurality of solder joints.

14. A semiconductor package comprising:
a first die coupled to a first substrate; a second die coupled to a second substrate;
a plurality of solder joints coupled between the first substrate and the second substrate,
at least one of the plurality of solder joints substantially comprising a portion of a figure eight in a cross-sectional view;
an epoxy layer on and surrounding the plurality of solder joints, the epoxy layer covering all of a solder material of the plurality of solder joints, the epoxy layer comprising a filler material, the filler material comprising SiO2 or aluminum nitride;
an underfill on and surrounding the epoxy layer and the plurality of solder joints, the underfill having a different material composition than the epoxy layer;
wherein the plurality of solder joints includes a metal stud; and
wherein the at least one of the plurality of solder joints contacts a first contact pad and a second contact pad on the first substrate and the second substrate, respectively, the metal stud of the at least one of the plurality of solder joints contacting the first contact pad but not contacting the second contact pad, at least a portion of the metal stud being exposed through a solder material of the at least one of the plurality of solder joints.

15. The semiconductor package of claim 14 further comprising a molding compound over the second substrate, the epoxy layer adjoining a first surface of the molding compound.

16. The semiconductor package of claim 15, wherein the first surface of the molding compound is substantially parallel to a major surface of the second substrate.

17. The semiconductor package of claim 15, wherein the epoxy layer adjoins a surface of the first substrate.

18. The semiconductor package of claim 14, wherein the epoxy layer comprises a greater thickness adjacent the plurality of solder joints proximate the first substrate and the second substrate than proximate a central region of the plurality of solder joints.

* * * * *